(12) United States Patent
Fuergut et al.

(10) Patent No.: US 7,575,173 B2
(45) Date of Patent: Aug. 18, 2009

(54) SMART CARD, SMART CARD MODULE, AND A METHOD FOR PRODUCTION OF A SMART CARD MODULE

(75) Inventors: Edward Fuergut, Dasing (DE); Bernd Goller, Otterfing (DE); Robert-Christian Hagen, Sarching (DE); Simon Jerebic, Regensburg (DE); Jens Pohl, Bernhardswald (DE); Peter Strobel, Regensburg (DE); Holger Woerner, Regensburg (DE)

(73) Assignee: Infineon Technologies, AG, Neubiberg (DE)

( * ) Notice: Subject to any disclaimer, the term of this patent is extended or adjusted under 35 U.S.C. 154(b) by 59 days.

(21) Appl. No.: 11/341,892

(22) Filed: Jan. 30, 2006

(65) Prior Publication Data

US 2006/0175419 A1 Aug. 10, 2006

Related U.S. Application Data

(63) Continuation of application No. PCT/DE2004/001363, filed on Jun. 28, 2004.

(30) Foreign Application Priority Data

Jul. 28, 2003 (DE) ................... 103 34 578

(51) Int. Cl.
*G06K 19/00* (2006.01)
(52) U.S. Cl. ..................... 235/487; 235/375
(58) Field of Classification Search ............... 235/375, 235/380, 486, 487
See application file for complete search history.

(56) References Cited

U.S. PATENT DOCUMENTS

| 5,745,988 | A | * | 5/1998 | Hohmann et al. ............. 29/841 |
| 5,756,379 | A | | 5/1998 | Haghiri-Tehrani |
| 6,013,945 | A | | 1/2000 | Haghiri-Tehrani |
| 6,497,371 | B2 | * | 12/2002 | Kayanakis et al. .......... 235/492 |
| 6,607,135 | B1 | * | 8/2003 | Hirai et al. .................. 235/487 |
| 6,779,733 | B2 | * | 8/2004 | Akita et al. ................. 235/492 |
| 2002/0184756 | A1 | | 12/2002 | Lowack et al. |
| 2003/0015774 | A1 | | 1/2003 | Auburger et al. |

FOREIGN PATENT DOCUMENTS

| DE | 19500925 | 7/1996 |
| WO | WO 96/02042 | 1/1996 |
| WO | WO 00/21027 | 4/2000 |

* cited by examiner

*Primary Examiner*—Karl D. Frech
(74) *Attorney, Agent, or Firm*—Edell, Shapiro & Finnan, LLC

(57) ABSTRACT

A smart card for contact data transmission includes a card body and a smart card module which is fitted in the card body. The smart card module includes a semiconductor chip with an active upper surface, a plastic housing compound that surrounds the semiconductor chip and includes at least one surface that is coplanar with the active upper surface of the semiconductor chip, a first dielectric layer that is arranged on the plastic housing compound surface and on the active upper surface of the semiconductor chip, one or more interposer metallization levels, which are isolated via further dielectric layers and are connected to the active upper surface of the semiconductor chip, and external contact surfaces. The external contact surfaces are formed on the outermost interposer level and facilitate contact data transmission. The smart card module uses no bonding wires and has a very small physical volume.

6 Claims, 2 Drawing Sheets

SMART CARD, SMART CARD MODULE, AND A METHOD FOR PRODUCTION OF A SMART CARD MODULE

CROSS REFERENCE TO RELATED APPLICATIONS

This application is a continuation of PCT/DE2004/001363, filed Jun. 28, 2004, and titled "Smart Card, Smart Card Module, and a Method for Production of a Smart Card Module," which claims priority under 35 U.S.C. §119 to German Application No. 103 34 578.7, filed on Jul. 28, 2003, and titled "Smart Card, Smart Card Module, and a Method for Production of a Smart Card Module," the entire contents of which are hereby incorporated by reference.

FIELD OF THE INVENTION

The invention relates to a smart card for contact data transmission, including a card body and a smart card module which is fitted in the card body. The invention also relates to a smart card module and to a method for production of a smart card module.

BACKGROUND

Smart cards and smart card modules have been known for a long time. For example, in DE 195 00 925 A1, a smart card module is described including a substrate on which a semiconductor chip and metallic connecting pads are arranged, with the semiconductor chip being connected to the connecting pads via bonding wires. The semiconductor chip and the bonding wires are surrounded by an encapsulation compound. The semiconductor chip and the metallic connecting pads are arranged on one surface of the substrate. The contact surfaces for contact data interchange with the smart card are located on the other surface of the substrate. Access openings to the contact surfaces are cut out in the substrate. This smart card module is fit in a smart card by being inserted into the opening that is provided there and being adhesively bonded to the card body.

The general procedure for manufacture of smart card modules such as the type described above is for the semiconductor chips to be fixed by their active upper surfaces to a mount tape with their active upper surfaces pointing upward. The semiconductor chips are generally fixed on the mount tape by adhesive bonding. The mount tape has metallic surfaces at appropriate points, whose lower surface is used later to make contact between the smart card module and the peripherals. The contact between the connecting pads on the active upper surfaces of the semiconductor chips and these contact surfaces is made by of a wire bonding technique.

The wire bonding method has the major disadvantage that the use of bonding wires restricts to a large degree the miniaturization of the smart card module. It is not possible to achieve smart card modules with very small physical heights, since the bonding wires have a physical extent which cannot be undershot.

An alternative embodiment for a smart card module is also described in DE 195 00 925 A1, in which the contact surfaces and connecting pads are formed by a leadframe on which the semiconductor chip is arranged directly. The semiconductor chip is electrically and conductively fixed by its connecting pads by flip-chip contact-making directly on the corresponding contact surfaces and the connecting pads. This embodiment is a so-called "chip scale package". "Chip scale packaging" is often also referred to by the abbreviation as "CSP".

In the case of CSP, which is a sub-type of flip-chip technology, interconnects are drawn directly on the active upper surface of the semiconductor chips, and solder balls, which facilitate the mounting of the semiconductor chip on a substrate, are then applied directly to these interconnects.

However, one major disadvantage of CSP technology is that the available active upper surface of the semiconductor chip generally does not offer sufficient area to produce all of the necessary external contacts. Furthermore, CSP technology is unsuitable for the manufacture of smart card modules because the semiconductor chips which are used in smart card modules are subject to significant miniaturization, that is to say to an extremely major "shrink".

Processing of smart card microcontrollers using CSP technology for production of smart card modules, as proposed in DE 195 00 925 A1, therefore does not appear to be a feasible solution.

SUMMARY OF THE INVENTION

The present invention replaces conventional smart card modules which have been produced by wire bonding technology by novel smart card modules whose physical height is considerably less than that of such conventional modules. In addition, the present invention facilitates large-scale production of smart card modules in an economic and efficient manner.

In accordance with the present invention, a smart card module is provided comprising a semiconductor chip including a rear surface, an active upper surface and side surfaces, a plastic housing compound that surrounds the semiconductor chip and includes at least one surface that is coplanar with the active upper surface of the semiconductor chip, and a first dielectric layer arranged on the active upper surface of the semiconductor chip and the at least one surface of the plastic housing compound that is coplanar with the active upper surface of the semiconductor chip. The smart card module further comprises one or more interposer metallization levels that are isolated or separated via further dielectric layers and are connected to the active upper surface of the semiconductor chip, and external contact surfaces that are formed on the outermost interposer level and to which contact metallization is applied for contact data transmission.

The above and still further objects, features and advantages of the present invention will become apparent upon consideration of the following detailed description of specific embodiments thereof, particularly when taken in conjunction with the accompanying drawings wherein like reference numerals in the various figures are utilized to designate like components.

PREFERRED EMBODIMENTS OF THE INVENTION

Figure 1:
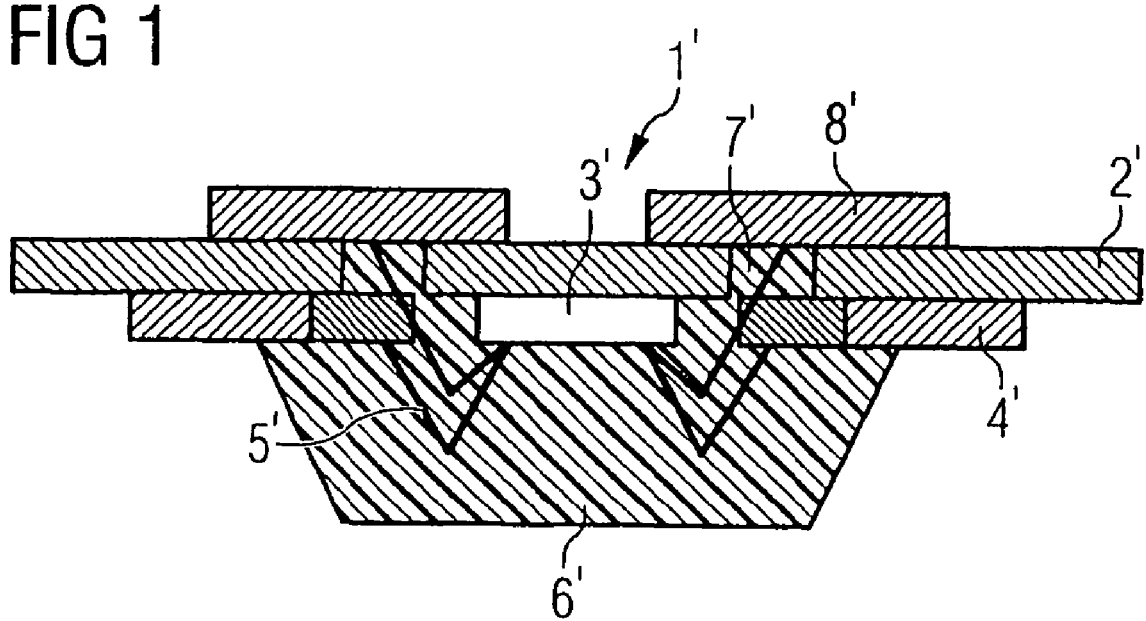
FIG. 1 depicts a side cross-sectional view of a smart card module in the prior art.

As noted above, a smart card module is provided in accordance with the present invention that comprises a semiconductor chip including a rear surface, an active upper surface and side surfaces, a plastic housing compound that surrounds the semiconductor chip and includes at least one surface that is coplanar with the active upper surface of the semiconductor chip, and a first dielectric layer arranged on the active upper surface of the semiconductor chip and the at least one surface of the plastic housing compound that is coplanar with the active upper surface of the semiconductor chip. The smart card module further comprises one or more interposer metallization levels that are isolated or separated via further dielectric layers and are connected to the active upper surface of the semiconductor chip, and external contact surfaces that are formed on the outermost interposer level and to which contact metallization is applied for contact data transmission.

The smart card module of the present invention has a very small physical height and is not subject to the problems of a chip scale package, since interposer levels are provided in a smart card module such as this.

The smart card module of the present invention further allows smart cards to be produced for contact data transmission, which include a card body and an upper smart card module which is fitted in the card body.

The smart card modules of the invention are produced particularly advantageously using a method in which a semiconductor wafer including semiconductor chips arranged in rows and columns is initially produced. The semiconductor chips include rear surfaces and active upper surfaces, with the active upper surfaces being provided with inner contact surfaces. These inner contact surfaces are also referred to as contact pads.

The semiconductor wafer is then separated into individual semiconductor chips. The semiconductor chips are then fit to a mount apparatus, with the individual semiconductor chips being positioned with their active upper surfaces on the upper surface of the mount apparatus. A plastic housing compound is then applied to the mount apparatus, so that a common mount composed of plastic housing compound is produced, with the semiconductor chips being embedded in the plastic housing compound. The mount apparatus is then removed, and a first dielectric layer is applied to the active upper surfaces (which have been exposed) of the semiconductor chips (which are embedded in a matrix of plastic), with this first dielectric layer now covering the active upper surfaces of the semiconductor chips and the exposed surfaces of the encapsulated plastic housing compound.

At least one or more interposer metallization levels, which are isolated via further dielectric layers, are now deposited onto this first deposited dielectric layer. The outermost interposer metallization level then has external contact surfaces to which the contact metallization is then applied, and is used for contact data interchange between the smart card and its peripheral. As the final step, the common mount composed of plastic housing compound is cut up into individual smart card modules.

In an exemplary embodiment of the present invention, the common mount composed of plastic housing compound is formed on the mount apparatus by injection molding processes and with the assistance of a mold.

The production of the common mount composed of plastic housing compounds can also be carried out by a centrifugal casting process.

The application of the interposer metallization levels to the common mount composed of plastic housing compound can be carried out by application of a closed metal layer and subsequent structuring of the metal layer by a photoresist technique.

In another embodiment of the present invention, the interposer metallization levels are applied to the common mount composed of plastic housing compound by a printing technique, in particular by screen printing.

As noted above, smart card modules formed by conventional methods limit the size to which the module can be decreased. Referring to FIG. 1, a conventional smart card module 1' is shown that includes an electrically insulating substrate 2' on which a semiconductor chip 3' is arranged. The smart card module 1' furthermore has metallic connecting pads 4', with the semiconductor chip 3' being connected to the connecting pads 4' via bonding wires 5'. The semiconductor chip 3' and the bonding wires 5' are surrounded by a plastic encapsulation compound 6', which protects them. The semiconductor chip 3' and the metallic connecting pads 4' are arranged on one surface of the electrically insulating substrate 2'. The contact surfaces 8' for contact data interchange between the smart card module 1' and its peripheral are arranged on the other surface of the substrate 2'. Access openings 7' to the contact surfaces 8' are cut out in the electrically insulating substrate 2'. As can be seen in FIG. 1, the arrangement of the bonding wires 5' significantly limit the physical volume of the smart card module.

The formation of a smart card module in accordance with the invention is described with reference to FIGS. 2A to 2E.

Figure 2A:
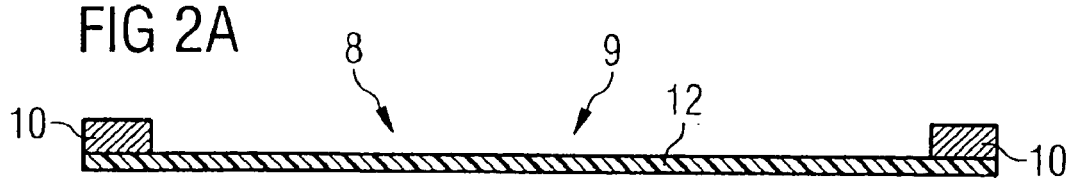
FIGS. 2A to 2E depict side cross-sectional views of a process procedure for construction of a smart card module in accordance with the present invention.

As can be seen in FIG. 2A, a mount apparatus 8 is first produced, including a mount frame 10 and an adhesive film 12.

Figure 2B:
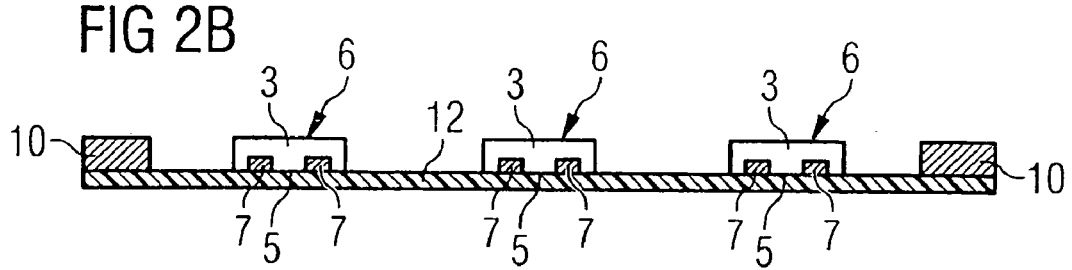

Referring to FIG. 2B, the mount apparatus 8 is then fit with semiconductor chips 3. The semiconductor chips 3 are applied with their active upper surfaces 5 contacting the upper surface 9 of the adhesive film 12. This is dependent on a completely processed semiconductor wafer being provided, which has semiconductor chips 3 arranged in rows and columns. The semiconductor chips 3 include active upper surfaces 5 and rear surfaces 6, with the active upper surfaces 5 being provided with contact surfaces 7. The semiconductor wafer is then separated into individual semiconductor chips 3, for example by sawing.

Figure 2C:
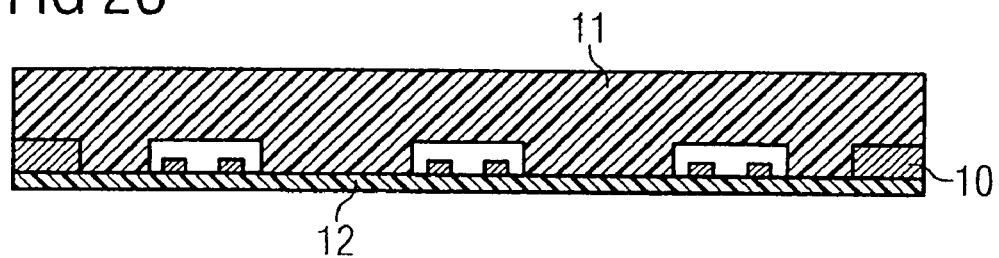

The semiconductor chips 3 are then surrounded with a plastic housing compound, thus forming a common mount 11 composed of plastic housing compound on the mount apparatus 8, in which the semiconductor chips 3 are embedded. This is shown in FIG. 2C. The process of surrounding the individual semiconductor chips 3 can in this case be carried out using wafer molding using the template printing process, by conventional encapsulation processes, using the spin-on process or using coating processes.

Figure 2D:
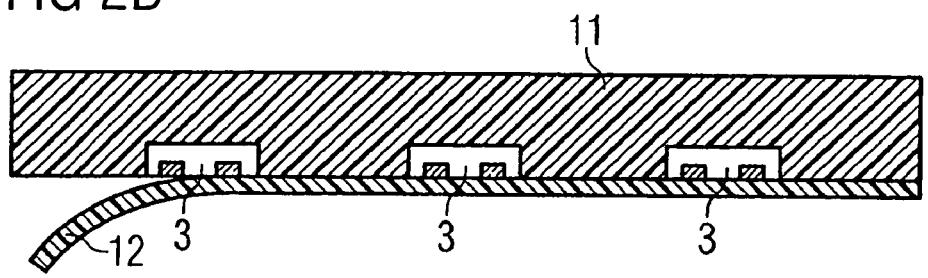

As can be seen from FIG. 2D, a further step is then to pull off the laminated-on adhesive film 12 once the plastic housing compound has cured. The mount frame 10 is removed first of all, and the adhesive film 12 which is adhering to the common mount composed of plastic housing compound 11 is either pulled off or stripped off.

Figure 2E:
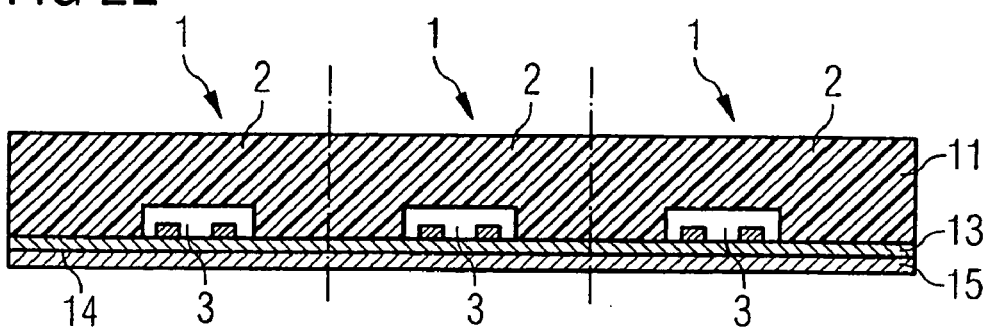

As shown in FIG. 2E, the next step is the formation of a dielectric layer, interposer metallizations 13, external contact surfaces 14 and the application of the contact metallization 15, which is used for contact data transmission between the smart card and its readers. A dielectric layer is deposited on the exposed active upper surfaces 5 of the semiconductor chips such that the dielectric layer covers the active upper surfaces 5 of the semiconductor chips and the exposed surfaces of the encapsulated plastic housing compound 11. Next, the interposer metallizations 13 are applied to the dielectric layer and over the active upper surfaces 5 and contact surfaces 7 of the semiconductor chips as well as coplanar surfaces of the plastic housing compound 11, followed by application of the contact metallization 15 to the external contact surfaces 14 of the interposer metallizations 13.

The common mount 11 is then cut up, as indicated by the dashed-dotted lines in FIG. 2E, thus resulting in the formation of individual smart card modules 1 with a plastic housing 2.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed:

1. A method of forming a smart card module with a plastic housing in which at least one semiconductor chip is arranged, the method comprising:

producing a semiconductor wafer with semiconductor chips that are arranged in rows and columns, each semiconductor chip including an active upper surface that is provided with inner contact surfaces;

separating the semiconductor wafer into individual semiconductor chips;

fitting a mount apparatus with the individual semiconductor chips such that the individual semiconductor chips are positioned with their active upper surfaces on the upper surface of the mount apparatus;

forming a common mount on the mount apparatus that comprises a plastic housing compound, wherein the semiconductor chips are embedded in the plastic housing compound;

removing the mount apparatus;

depositing a dielectric layer on a surface of the common mount that is at least partially defined by the active upper surfaces of the semiconductor chips;

depositing at least one interposer metallization level on the dielectric layer;

applying a contact metallization to an external contact surface of an outermost interposer metallization level, wherein the contact metallization is configured to facilitate contact data transmission; and separating the common mount into individual smart card modules.

2. The method of claim 1, wherein the common mount comprising the plastic housing compound is formed via injection molding.

3. The method of claim 1, wherein the common mount comprising the plastic housing compound is formed via centrifugal casting.

4. The method of claim 1, wherein the deposition of at least one interposer metallization level comprises applying a closed metal layer and structuring the closed metal layer by a photoresist technique.

5. The method of claim 1, wherein the at least one interposer metallization level is deposited via a printing technique.

6. The method of claim 5, wherein the printing technique is a screen printing technique.

* * * * *